United States Patent
Pavlovic

(10) Patent No.: US 8,038,465 B2
(45) Date of Patent: Oct. 18, 2011

(54) ELECTRICAL CONNECTOR AND HEAT SINK

(75) Inventor: Slobodan Pavlovic, Canton, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 12/704,121

(22) Filed: Feb. 11, 2010

(65) Prior Publication Data

US 2010/0144172 A1    Jun. 10, 2010

Related U.S. Application Data

(63) Continuation-in-part of application No. 12/006,973, filed on Jan. 7, 2008, now Pat. No. 7,713,096.

(51) Int. Cl.
*H01R 13/00* (2006.01)
(52) U.S. Cl. .................... 439/485; 361/719
(58) Field of Classification Search ............. 439/485, 439/487; 361/704, 705, 719, 720, 721
See application file for complete search history.

(56) References Cited

U.S. PATENT DOCUMENTS

| | | | |
|---|---|---|---|
| 3,638,073 A * | 1/1972 | Bernstein | 361/712 |
| 4,082,407 A | 4/1978 | Smorzaniuk et al. | |
| 4,425,018 A | 1/1984 | Stenz | |
| 5,079,672 A * | 1/1992 | Haubner et al. | 361/705 |
| 5,124,883 A | 6/1992 | Bakker | |
| 5,353,191 A | 10/1994 | Volz et al. | |
| 5,411,236 A | 5/1995 | Morita et al. | |
| 5,535,513 A | 7/1996 | Frantz | |
| 5,951,306 A | 9/1999 | Millhimes | |
| 6,056,558 A | 5/2000 | Lin et al. | |
| 6,083,047 A | 7/2000 | Paagman | |
| 6,113,053 A | 9/2000 | Kumagai et al. | |
| 6,152,742 A | 11/2000 | Cohen et al. | |
| 6,171,149 B1 | 1/2001 | Van Zanten | |
| 6,406,335 B2 | 6/2002 | Sato et al. | |
| 6,422,878 B1 | 7/2002 | Pape et al. | |
| 6,501,665 B1 | 12/2002 | Ted | |
| 6,527,588 B2 | 3/2003 | Paagman | |
| 6,540,566 B1 | 4/2003 | Wu | |
| 6,609,929 B2 | 8/2003 | Kamarauskas et al. | |
| 6,638,114 B2 | 10/2003 | Lee | |
| 6,644,985 B2 | 11/2003 | Wilson et al. | |
| 6,692,265 B2 | 2/2004 | Kung et al. | |
| 6,808,420 B2 | 10/2004 | Whiteman, Jr. et al. | |
| 6,840,810 B2 | 1/2005 | Brunker et al. | |
| 6,881,100 B2 | 4/2005 | Barry et al. | |
| 6,945,828 B2 | 9/2005 | Kamei et al. | |
| 6,979,238 B1 | 12/2005 | Mongold et al. | |
| 7,059,907 B2 | 6/2006 | Winings et al. | |

(Continued)

*Primary Examiner* — Thanh Tam Le
(74) *Attorney, Agent, or Firm* — MacMillan, Sobanski & Todd, LLC

(57) ABSTRACT

A vehicle power distribution circuit board has interconnected electronic components and a connector mounted thereon. The interconnected electronic components include one or more heat generating components. The connector includes a main body formed of an electrically insulating material for supporting a plurality of terminals. The terminals have first ends connected to the circuit board and second ends adapted to be connected to a mating connector of a vehicle wiring harness. The main body of the connector is configured to form an air gap between the main body and the circuit board, and the terminals extend from the main body to the first end through the gap. Also, the connector is positioned on the circuit board with a thermally conductive path from one of the heat generating components to the gap such that the terminals within the air gap function as a heat sink to dissipate heat from the heat generating component.

12 Claims, 5 Drawing Sheets

U.S. PATENT DOCUMENTS

| | | |
|---|---|---|
| 7,074,086 B2 | 7/2006 | Cohen et al. |
| 7,182,643 B2 | 2/2007 | Winings et al. |
| 7,247,045 B1 | 7/2007 | Arellano |
| 7,278,886 B2 | 10/2007 | Cohen et al. |
| 7,297,027 B2 | 11/2007 | Liang |
| 7,303,401 B2 | 12/2007 | Schell et al. |
| 7,338,298 B2 * | 3/2008 | Lappoehn ................ 439/83 |
| 7,697,300 B2 * | 4/2010 | Brandt et al. ............ 361/736 |
| 7,751,193 B2 * | 7/2010 | Tominaga et al. ........ 361/715 |
| 7,751,194 B2 * | 7/2010 | Sakamoto et al. ........ 361/719 |
| 2002/0177334 A1 | 11/2002 | Akama et al. |
| 2005/0020108 A1 | 1/2005 | Ju |
| 2005/0064745 A1 | 3/2005 | Zhang |
| 2006/0216970 A1 | 9/2006 | Pavlovic |

* cited by examiner

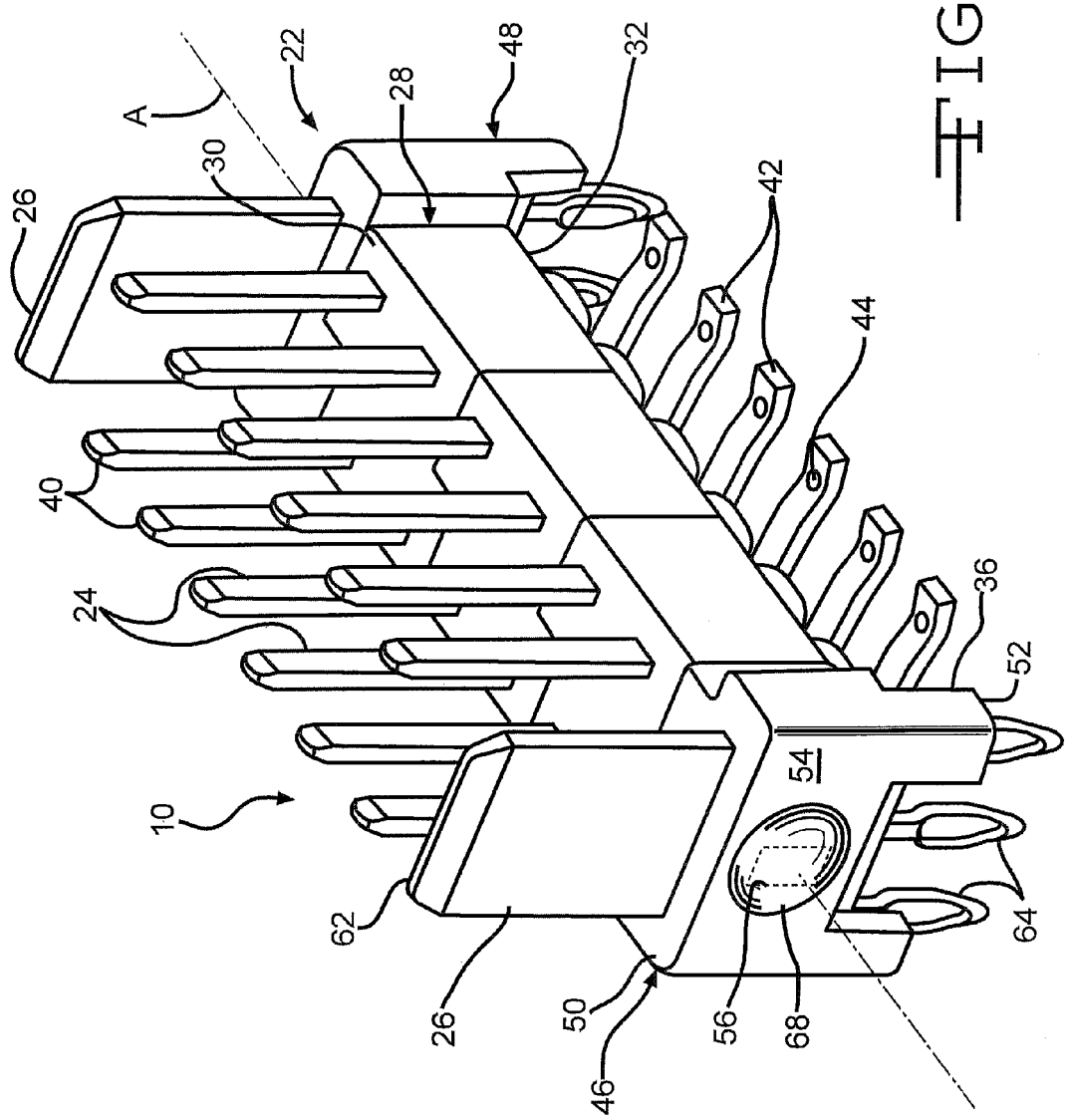

ELECTRICAL CONNECTOR AND HEAT SINK

CROSS-REFERENCE TO RELATED APPLICATIONS

This application is a continuation-in-part patent application of U.S. patent application Ser. No. 12/006,973, filed Jan. 7, 2008, the disclosure of which is incorporated herein by reference.

BACKGROUND OF THE INVENTION

This invention relates in general to printed circuit boards (PCBs). In particular, this invention relates to an improved heat sink for removing excess heat produced by electronic components on a PCB.

As the use of electronic devices becomes increasingly prevalent, there is a desire to provide an increasing number of electronic components on PCBs. In many applications, electrical connections on PCBs are being made with surface mount technology (SMT). With SMT components, blade terminals are connected to a surface on one side of the PCB, usually by soldering. This leaves the opposite side of the PCB available for constructing a different circuit using SMT components. This allows a greater number of circuits to be installed on a single PCB.

The electronic components mounted on a PCB can generate heat as they operate. This heat will raise the temperature of the PCB and attached components. The PCB can be damaged if the temperature becomes high enough. Therefore, it is desirable to remove excess heat from a PCB. Heat can often be removed from a PCB using a heat sink. A typical heat sink is made of a thermally conductive material and has a base in contact with a hot component. The heat sink has several fins that increase the surface area of the sink and allow it to transfer heat into the surrounding air.

With an increasing number of electronic components being mounted on a PCB, there is the potential for an increasing amount of heat to be created. Also, putting additional components on a PCB reduces the amount of space available for the attachment of heat sinks. It would be desirable to provide an improved mechanism for removing excess heat from a PCB.

SUMMARY OF THE INVENTION

This invention relates to a vehicle power distribution circuit board. The circuit board has interconnected electronic components and a connector mounted thereon. The interconnected electronic components include one or more heat generating components. The connector includes a main body formed of an electrically insulating material for supporting a plurality of terminals. The terminals have first ends connected to the circuit board and have second ends adapted to be connected to a mating connector of a vehicle wiring harness. The main body of the connector is configured to form an air gap between the main body and the circuit board, and the terminals extend from the main body to the first ends through the gap. Also, the connector is positioned on the circuit board with a thermally conductive path from one of the heat generating components to the gap such that the terminals within the air gap function as a heat sink to dissipate heat from the one power component.

Various aspects of this invention will become apparent to those skilled in the art from the following detailed description of the preferred embodiments, when read in light of the accompanying drawings.

BRIEF DESCRIPTION OF THE DRAWINGS

FIG. 1 is a perspective view of a first embodiment of a modular electrical connector.

DETAILED DESCRIPTION OF THE PREFERRED EMBODIMENTS

Figure 2A:
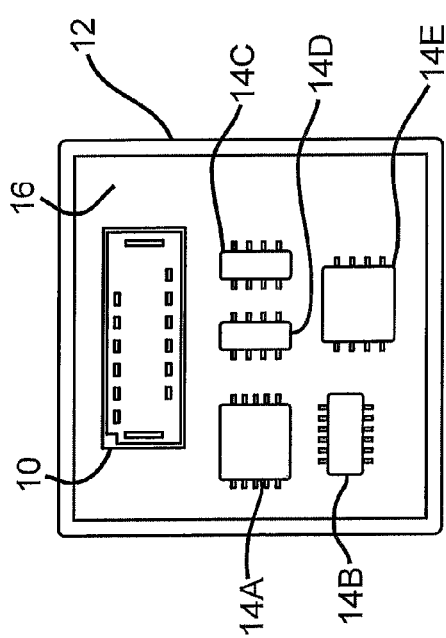
FIG. 2A is a top plan view of an electrical box for a vehicle that includes a first printed circuit board and the modular electrical connector illustrated in FIG. 1
Figure 2B:
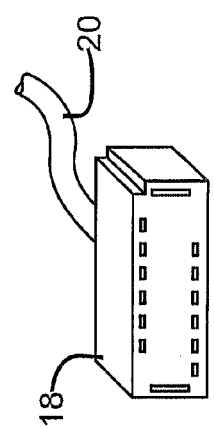
FIG. 2B is a perspective view of an in-line connector structured and configured to mate with the modular electrical connector illustrated in FIG. 1.

Referring now to the drawings, there is illustrated in FIG. 1 a first embodiment of a surface mount technology (SMT) modular electrical connector, indicated generally at 10. The illustrated electrical connector 10 is a header connector that can be used in an electrical box such as may be used in a vehicle, such as the electrical box 12 shown in FIG. 2A. The electrical box 12 may, for example, be a power distribution box, a junction box, and the like. As shown in FIG. 2A, the electrical box 12 includes a plurality of electronic components 14A, 14B, 14C, 14D, and 14E, which are attached to a PCB 16. If, for example, the electrical box 12 is a power distribution box in a vehicle, an in-line connector 18, as shown in FIG. 2B, may be used to connect the electrical connector 10 to various systems within the vehicle via a wiring harness 20.

Figure 4:
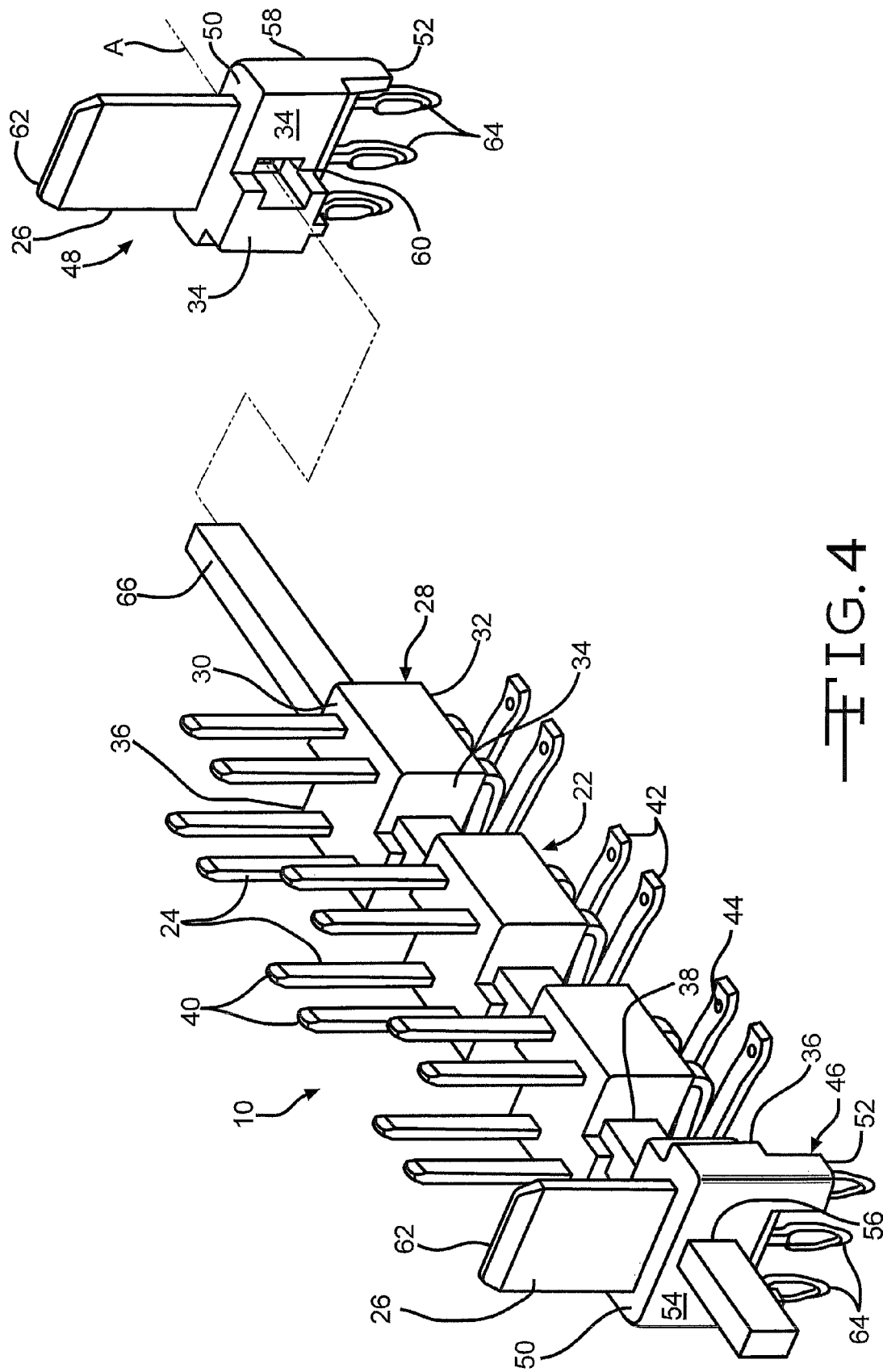
FIG. 4 is an exploded perspective view of the modular electrical connector illustrated in FIG. 1.

Referring to FIGS. 1 and 4, the electrical connector 10 includes a body 22 and a plurality of electrical terminals 24 and 26. The body 22 includes one or more body portions 28 having an axis A, an upper or first surface 30, a lower or second surface 32, a first mating surface 34, and second mating surface 36. The illustrated electrical connector 10 includes three identical body portions 28, but the electrical connector may include a different number of body portions and may include different types of body portions. An axially extending mounting aperture 38 is formed between the mating surface 34 and the mating surface 36.

Figure 3:
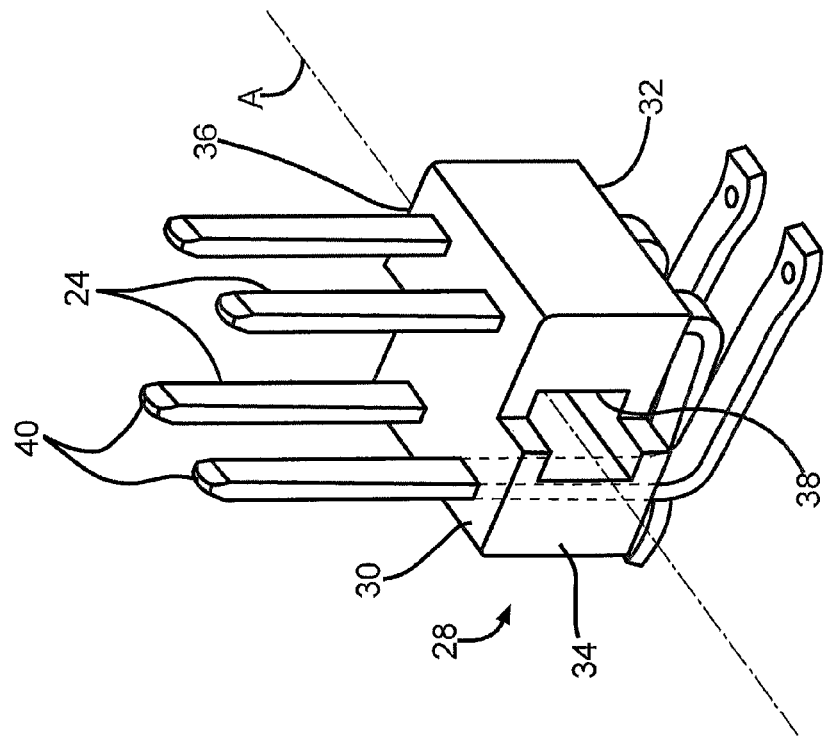
FIG. 3 is an enlarged perspective view of a body portion of the modular electrical connector illustrated in FIG. 1.

As best shown in FIG. 3, four terminals 24 are integrally formed with each illustrated body portion 28. Each terminal 24 is substantially L-shaped and has a blade end 40 (extending upwardly from the body portion 28 when viewing FIG. 3) and an SMT end 42 (extending downwardly from the body portion 28 when viewing FIG. 3) having a solder aperture 44.

The SMT end 42 of the terminals 24 may be connected to a PCB 16 by any SMT connection methods that are familiar to those skilled in the art, such as the method described in U.S. patent application Ser. No. 11/624,409. The method of connecting an SMT terminal end disclosed therein is incorporated herein by reference.

The body portions 28 may be formed from plastic such as polyamide (PA), polyphthalamide (PPA), or other desired thermoplastic material. The body portions 28 may also be formed of thermally conductive material, such as ceramic and polymer filled with heat conductive fibers and/or fillers. Thermally conductive body portions 28 will create an equalization block, enhance heat transfer between terminal blade ends 40, and improve PCB heat dissipation performance. It will be understood that some body portions, such as the body portions 28, may be made of high temperature capable polymers, and that other body portions may be made of relatively lower performance or relatively lower temperature capable polymers.

In the illustrated embodiment, the blade ends 40 are 2.8 mm blade terminals. Alternatively, the blade ends 40 may be any other desired type of terminal, such as 0.64 mm, 1.2 mm, 1.5 mm, 4.8 mm, and 6.3 mm blade terminals.

The body 22 also includes a first end portion 46 and a second end portion 48. The first end portion 46 has an upper or first surface 50, a lower or second surface 52, an end surface 54, and the second mating surface 36. An axially extending mounting aperture 56 is formed between the end surface 54 and the second mating surface 36. The second end portion 48 is substantially similar to the end portion 46 and has an upper or first surface 50, a lower or second surface 52, an end surface 58, and the first mating surface 34. An axially extending mounting aperture 60 is formed between the end surface 58 and the first mating surface 34.

In the illustrated embodiment, one of the terminals 26 is integrally formed with each of the end portions 46 and 48. Each terminal 26 has a blade end 62 (extending upwardly from the end portion 46 as shown in FIG. 4) and an eye-of-the-needle terminal end 64 (extending downwardly from the end portion 46 as shown in FIG. 4). Such eye-of-the-needle terminal ends 64 attach the connector body 22 to the PCB 16 and ensure that the body 22 remains attached to the PCB 16 during the soldering of the SMT ends 42 of the terminal 24.

Alternatively, the terminals 24 and 26 may be "stitched in" to the body portions 28 and the end portions 46 and 48, respectively, in an automated manufacturing operation that is familiar to those skilled in the art.

The end portions 46 and 48 may be formed from plastic, such as for example; polyamide (PA), polyphthalamide (PPA), or other desired thermoplastic material. The end portions 46, 48 may be formed of thermally conductive material, such as ceramic, and polymer filled with conductive fibers and/or fillers to create equalization block, enhance heat transfer between terminal blade ends 62, and improve PCB heat dissipation performance. It will be understood that some end portions, such as the end portions 46, 48 may be made of high temperature capable polymers, and that other body portions may be made of relatively lower performance or relatively lower temperature capable polymers. In the illustrated embodiment, the blade end 62 is a 6.3 mm blade terminal. Alternatively, the blade end 62 may be any other desired type and size of terminal, such as 9.5 mm blade terminal.

As best shown in FIGS. 1 and 4, the electrical connector 10 may be described as modular, that is, the electrical connector 10 may be created by assembling selected component parts. For example, the electrical connector 10 may be built by providing the connecting rod 66 and assembling any desired number of body portions 28 on the connecting rod 66 between the first end portion 46 and the second end portion. The connecting rod 66 will extend through the mounting apertures 38, 56, 60, such that a portion of the rod 66 extends outwardly beyond the end surfaces 54 and 58. The ends of the rod 66 may then be deformed, as shown at 68 in FIG. 1, by any desired method, such as by heat staking or by sonic welding. The illustrated rod 66 has a rectangular cross section to prevent rotation and/or axial bending of the assembled components prior to heat staking or sonic welding. Alternatively, the rod 66 may have any other desired cross sectional shape, such as square, triangular, other geometric shapes, and oval and irregular shapes.

In the illustrated embodiment, the mating surfaces 34 and 36 are stepped. It will be understood however, that the mating surfaces 34 and 36 may have any desired shape which facilitates the interconnection of the mating surfaces 34 and 36.

In the embodiment illustrated in FIG. 1, the electrical connector 10 includes three body portions 28. It will be understood however, that the electrical connector 10 may be formed with any desired number of body portions, such as one body portion 28, two body portions 28, or four or more body portions 28.

The small size of the body portion 28 and end portions 46, 48 relative to known SMT connector strips minimizes the effect of material shrinkage and warping that can occur when molding or forming larger connector strips or components. Accordingly, lower cost polymers may be used. Additionally, the final assembly process of the electrical connector 10 allows for adjustment and alignment of the component body portions 28 and end portions 46, 48, such that required tolerances may be easily achieved.

By standardizing the size and geometry of the internal components (i.e., the terminals 24) and external components (i.e., the body portions 28), a common mold tool may be used, reducing cost. Additionally, automated assembly equipment may be used for final electrical connector 10 assembly.

The electrical connector 10 described herein above is modular and scalable to allow the manufacture of multiple different PCB header connectors, such as the electrical connector 10, using different combinations of the body portions 28, end portions 46, 48, and rods 66, and processes, such as heat staking or sonic welding.

It will be understood that the body portions 28 and end portions 46 and 48 may have any desired number and combination of electrical terminals, such as the terminals 24 and 26. For example, one body portion 28 may have a first combination of electrical terminals 24, an adjacent body portion 28 may have a second combination of electrical terminals 24, and the end portions 46 and 48 may have a third combination of electrical terminals 26, advantageously allowing for modularity and scalability to allow the manufacture of multiple different PCB header connectors.

Reduced overall complexity of the component parts of the electrical connector 10 allows for efficient use of manufacturing equipment. For example, one family mold (i.e., a single molding tool with multiple cavities for all assembly components) may be used to form the body portions 28, end portions 46, 48, and rod 66. A single assembly machine may be used to stitch terminals 24 into the body portions 28, end portions 46, 48 (if the terminals 24 are not integrally molded therewith).

Figure 5:
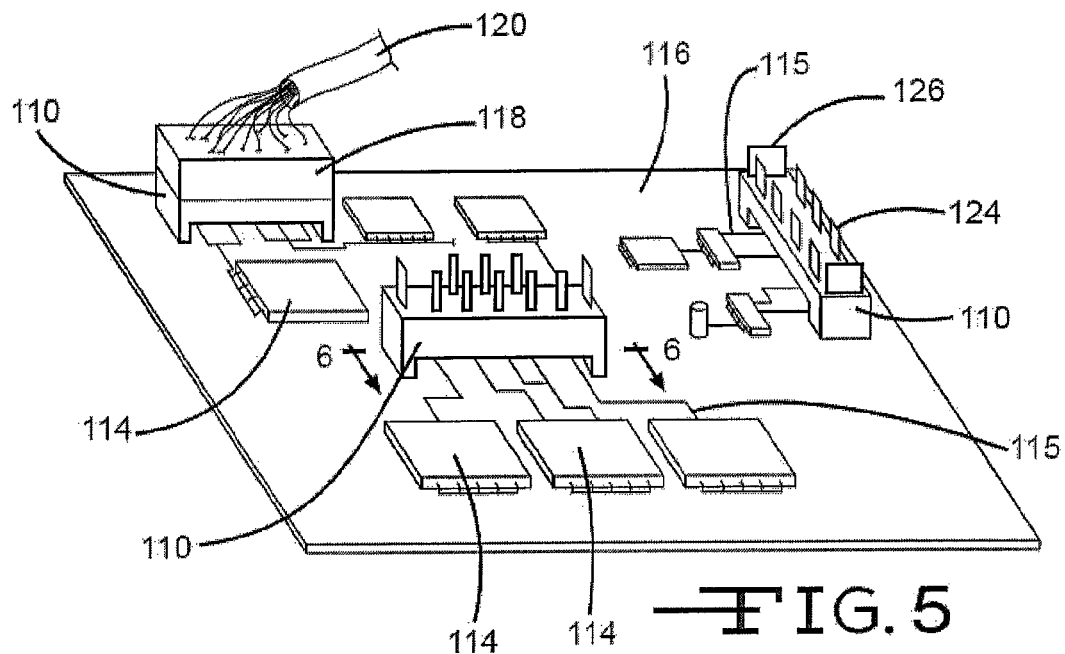
FIG. 5 is a perspective view of a second printed circuit board including multiple electrical connectors.

Referring now to FIG. 5, there is shown a perspective view of a second PCB 116. The second PCB 116 is a power distribution circuit board, but may be any other type of circuit board. The second PCB 116 includes a plurality of electronic components 114. The electronic components 114 may include switches, resistors, capacitors, solid state components, or any other type of electronic component. The electronic components 114 are attached by surface mounting, but may be attached in other ways. The second PCB 116 also includes multiple electrical connectors 110. The electrical connectors 110 have different configurations of electrical terminals 124 and 126.

The second PCB 116 also includes a series of traces 115. The traces are electrically conductive pathways that serve to connect the electrical connectors 110 and the electronic components 114. The traces 115 are made of a suitable electrically conductive material, such as copper. However, other desired materials may be used. It should be appreciated that the configuration of electronic components 114, electrical connectors 110, and traces 115 shown in FIG. 5 is for descriptive purposes only and is not intended to depict an actual circuit layout.

The electrical connectors 110 are connected to in-line connectors 118 and wiring harness 120. Only one in-line connector 118 and one wiring harness 120 are shown in FIG. 5 for clarity. The wiring harnesses 120 allow the second PCB 116 to connect to various systems (not shown) located remotely from on the second PCB 116.

Figure 6:
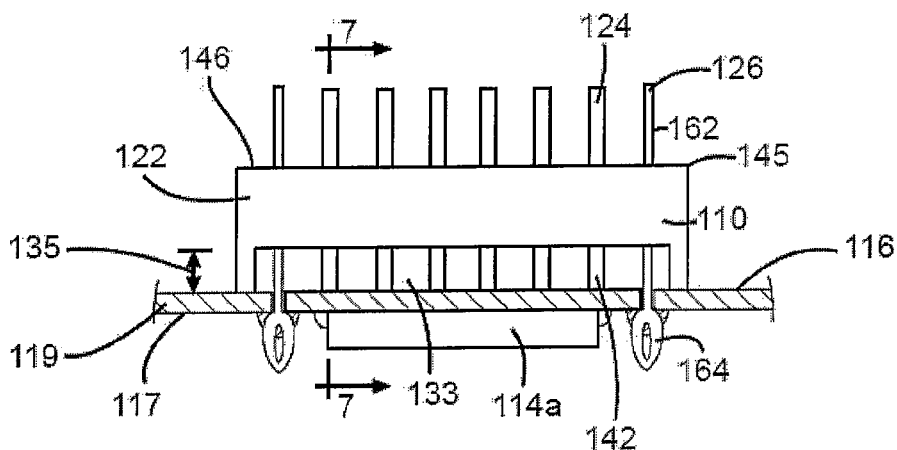
FIG. 6 is a cross sectional view taken through line 6-6 of FIG. 5.
Figure 7:
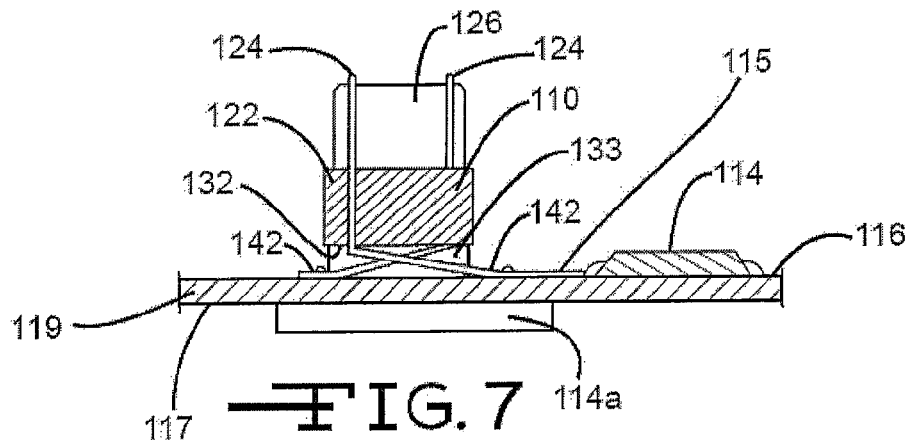
FIG. 7 is a cross sectional view taken through line 7-7 of FIG. 6.

Referring now to FIGS. 6 and 7, cross sectional views of a portion of the second PCB 116 are shown. The cross section shown in FIG. 6 is taken along line 6-6 of FIG. 5 and is taken through one of the electrical connectors 110. The cross section shown in FIG. 7 is taken along line 7-7 of FIG. 6. As shown, the electrical connector 110 includes a body 122 and a plurality of electrical terminals 124 and 126. It should be appreciated that the electrical connector 110 may be a modular electrical connector, as described in reference to FIGS. 1 through 6, but that this is not necessary, and the electrical connector 110 may be a non-modular design, if desired. The body portion 122 may be formed from plastic, such as for example, polyamide (PA), polyphthalamide (PPA), or other desired material. The body 122 may be formed of thermally conductive material, such as ceramic and polymer filled with heat conductive fibers and/or fillers.

The surface mounted ends of terminal 124 are connected to the second PCB 116 by the method described in U.S. Pat. No. 7,458,828, though they may be connected by any desired methods. Each terminal 126 has a blade end 162 and an eye-of-the-needle terminal end 164. Such eye-of-the-needle terminal ends 164 attach the connector body 122 to the second PCB 116 and help the body 122 remain attached to the second PCB 116 during the soldering of SMT ends 142 of the terminals 124. As described in U.S. Pat. No. 7,458,828, a solder aperture on the SMT end 142 of the terminal 124 assists in obtaining a good electrical connection between the terminal 124 and the second PCB 116. By obtaining a good electrical connection between these components, there is less resistance to electrical conductivity and less waste heat is generated at these connections. It should also be appreciated that a good electrical connection between the terminal 124 and the second PCB 116 also provides improved thermal conductivity between the terminal 124 and the second PCB 116.

The electrical connector 110 includes an optional space or gap 133 between a lower surface 132 of the body 122 and the second PCB 116. The body 122 is situated a distance or height 135 from the second PCB 116. The height 135 may be any desired size. The gap 133 allows air to circulate past the SMT ends 142 of the terminals 124. This air circulation allows an increased amount of heat to be removed by convection. As shown, the L-shaped terminals 124 are situated so that they pass through the gap 133. It should be appreciated that the L-shaped configuration of the terminals 124 increases the surface area of the terminals 124 that is exposed within the gap 133. That is, the terminal 124 travels from the lower surface 132 of the body 122 to the second PCB 116 along a path that is greater than the height 135 of the gap 133. This increased length of the terminals 124 further increases the amount of heat that can be removed from the terminals 124 by convection.

The gap 133 facilitates natural convection, as heated air is able to flow away from the terminals 124. It should be appreciated that a fan or blower (not shown) could be included to provide for forced convection in order to further assist with removal of excess heat from the connector 110.

By making the body portion 122 of the electrical connector 110 of thermally conductive material, the electrical connector 110 has an increased heat capacity. That is, the electrical connector 110 is able to store a greater amount of heat than it would be if it were made of material that is not thermally conductive. Also, the electrical connector 110 provides an equalization block. That is, heat is able to transfer along its length. Thus, if a first end portion 146 is at a higher temperature than a second end portion 145, the excess heat is able to conduct along the thermally conductive portions of the electrical connector 110.

The in-line connector 118 (shown in FIG. 5) is also formed of thermally conductive material, such as ceramic and polymer filled with heat conductive fibers and/or fillers. Therefore, the in-line connector 118 also acts as part of the equalization block, along with the electrical connector 110.

It should be appreciated that the described features of the electrical connector 110 make it suitable for use as a heat sink for the second PCB 116. That is, the electrical connector 110 is able to remove excess heat generated by the electric component 114. The gap 133 and the arrangement of the terminals 124 allows convection to remove excess heat. Additionally, heat in the electrical connector 110 will be conducted away through the heat conductive wiring in the attached wiring harness 120. It should be appreciated that the electrically conductive wiring in the wiring harness 120 will transfer excess heat away from the electrical connector 110. However, it should also be appreciated that additional heat conductive elements may be included in the wiring harness 120, if desired. By making the electrical connector 110 of a thermally conductive material, excess heat at any hot spots on the electrical connector 110 is able to transfer to cooler parts of the electrical connector 110 and into the attached wiring harness 120.

By using the electrical connectors 110 as heat sinks for the electrical components 114, the number of traditional heat sinks required to maintain the second PCB 116 at a desired temperature can be reduced. This allows the circuit board to be smaller than it otherwise would be because less surface area is occupied by the traditional heat sinks.

Referring back to FIG. 5, it can be seen that the electric components 114 are mounted on the second PCB 116 at various distances from the various electrical connectors 110. By reducing the distance separating the electric components 114 and the electrical connectors 110, the amount of heat transferred from a given electrical component to an electrical connector can be increased. The electrically conductive traces 115 are also thermally conductive, allowing heat from the electric components 114 to transfer away from the relatively hot electric component 114 and to the relatively cool electrical connector 110. It should be appreciated that additional thermally conductive material (not shown) may be included to facilitate this heat transfer. Because the electric components 114 are mounted in closer proximity to the electric connectors 110, the size of the circuit board may be reduced because the density of elements on the circuit board is increased.

The previous description has described the electrical components 114 and the electrical connectors as being on one side of the second PCB 116. This side is the A-side of the second PCB 116. In further reference to FIGS. 6 and 7, an electric component 114a is shown mounted on a B-side 117 of the second PCB 116. It should be appreciated that the B-side 117 refers to the opposite side of the second PCB 116 from the A-side. The B-side 117 is an arbitrary designation, and the B-side 117 is physically no different from the A-side of the second PCB 116. The B-side 117 of the second PCB may include additional electric components, traces, and electrical connectors (not shown). It should be appreciated that the electric component 114a will transfer heat through a substrate 119 of the second PCB 116 to the electrical connector 110. The electrical connector 110 will then act as a heat sink for the electric component 114a. Additionally, vias (not shown) may be provided through the substrate 119 of the second PCB 116 connecting the electrical connector 110 and the electric component 114a. The vias are electrically conductive pathways that may be used to transfer electric power from the electrical connector 110 on the A-side of the PCB to the electric component 114a on the B-side 117 of the PCB. The vias may simultaneously assisting in the transfer of excess heat from the electric component 114a to the electrical connector 110. Although the illustrated embodiment has described using the electrical connector 110 on the A-side as a heat sink, it should be appreciated that electrical connectors (not shown) on the B-side 117 of the second PCB 116 may also be used as heat sinks for the electric components 114 and 114a.

Figure 8:
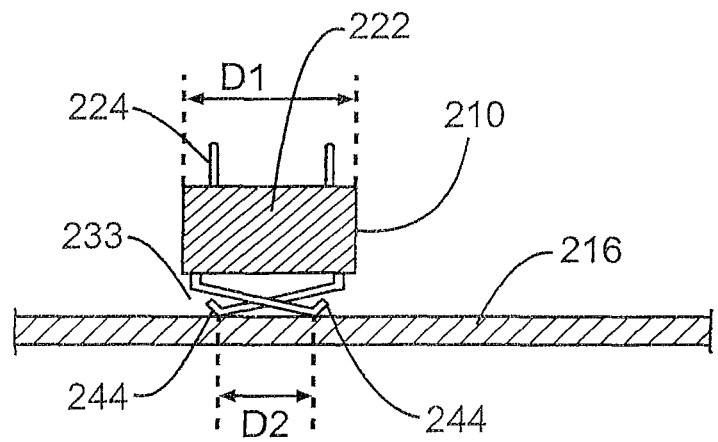
FIG. 8 is a cross sectional view, similar to that shown in FIG. 7, of an electrical connector with a first alternative terminal design, in which the terminals are located within a gap.
Figure 9:
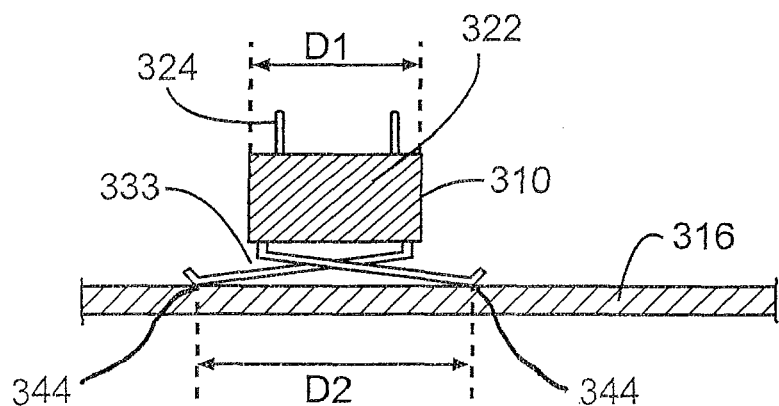
FIG. 9 is a cross sectional view, similar to that shown in FIGS. 7 and 8, of an electrical connector with a second alternative terminal design, in which the terminals extend outside the gap.
Figure 10:
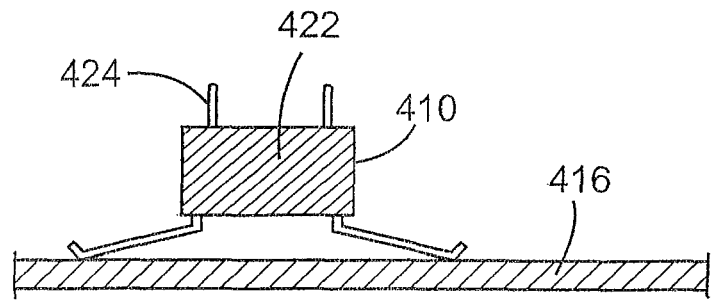
FIG. 10 is a cross sectional view, similar to that shown in FIGS. 7, 8, and 9, of an electrical connector with a third alternative terminal design, in which the terminals do not cross each other and extend outside the gap.

Referring to FIGS. 8 through 10, schematic views are shown illustrating various ways that an electrical connector may be attached to a circuit board. FIG. 8 illustrates a PCB 216 including an electrical connector 210. The electrical connector 210 includes terminals 224. The terminals 224 extend through a gap 233. The electrical connector 210 has a body portion 222 with a width D1. The terminals 224 are attached to the PCB 216 at contact points 244. The contact points 244 on opposite sides of the electrical connector 210 are laterally spaced from each other by a distance D2. The distance D2 is less than the width D1 and the terminals 224 are located entirely within the gap 233.

FIG. 9 illustrates a PCB 316 including an electrical connector 310. The electrical connector 310 has a body portion 322 with a width D1. Terminals 324 extend through a gap 333 and are attached to the PCB 316 at contact points 344. The contact points 344 on opposite sides of the electrical connector 310 are laterally spaced from each other by a distance D2. The distance D2 is greater than the width D1 and the terminals 324 extend laterally outside of the gap 333.

FIG. 10 illustrates a PCB 416 including an electrical connector 410. The electrical connector 410 includes a body portion 422 and terminals 424. The terminals 424 extend from the body portion 422 and diverge from each other. That is, unlike the embodiments illustrated in FIG. 5 through 9, the terminals 424 do not cross over each other when viewed in the lateral cross section.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A vehicle power distribution circuit board including
a circuit board carrying interconnected electronic components mounted thereon and having a connector mounted thereon,
the interconnected electronic components including one or more heat generating components,
the connector including a main body formed of an electrically insulating material for supporting a plurality of terminals having first ends connected to the circuit board and having second ends adapted to be connected to a mating connector of a vehicle wiring harness, characterized in that:
the main body of the connector is configured to form an air gap between the main body and the circuit board;
the terminals extend from the main body to the first end through the gap; and
the connector is positioned on the circuit board with a thermally conductive path from one of the heat generating components to the gap such that the terminals within the air gap function as a heat sink to dissipate heat from the heat generating component, wherein
wherein the terminals extend along paths from the main body to the circuit board,
the length of one or more of the paths is greater than a distance between the main body and the circuit board, and
one or more of the terminals include a bend between the first end and the body, and further comprising
a first set of terminals supported on a first side of the body and a second set of terminals supported on a second side of the body, wherein
the terminals in the first set bend in a first direction, and the terminals in the second set bend in a second direction, opposite the first direction, and
the first direction is toward the second side of the body and the second direction is toward the first side of the body such that the first and second sets of terminals cross each other when viewed laterally.

2. The vehicle power distribution circuit board of claim 1, further characterized in that the heat generating component is mounted on a first side of the circuit board, and that the connector is mounted on a second side of the circuit board.

3. The vehicle power distribution circuit board of claim 2, further characterized in that the heat generating component is mounted on the first side of the circuit board directly opposite the connector.

4. The vehicle power circuit board of claim 1, wherein the terminals remain substantially within the gap.

5. The vehicle power distribution circuit board of claim 4, further characterized in that the heat generating component is mounted on a first side of the circuit board, and the connector is mounted on a second side of the circuit board.

6. The vehicle power distribution circuit board of claim 5, further characterized in that the heat generating component is mounted on the first side of the circuit board directly opposite the connector.

7. The vehicle power distribution circuit board of claim 1, further characterized in that the heat generating component is mounted on a first side of the circuit board, and the connector is mounted on the first side of the circuit board.

8. The vehicle power distribution circuit board of claim 7, further comprising conductive traces on the circuit board, the traces connected to the heat generating components and the connector.

9. The vehicle power circuit board of claim 1, wherein the terminals extend laterally outside of the gap.

10. A circuit board assembly comprising:
a circuit board having a plurality of interconnected electronic components supported thereon; and
a connector that is adapted to connect the plurality of interconnected electronic components to a wiring harness, the connector including a main body having a first side and a second side, a first plurality of terminals supported on the first side of the main body of the connector, and a second plurality of terminals supported on the second side of the main body of the connector;
wherein each of the first and second pluralities of terminals has a first end that is connected to the circuit board and a second end that is adapted to be connected to a mating connector of the wiring harness; and
wherein the first and second pluralities of terminals support the main body relative to the circuit board such that a gap is provided therebetween, and
wherein each of the first plurality of plurality terminals extends through the gap from the first side the main body of the connector toward the second side thereof, and each of the second plurality of plurality terminals extends through the gap from the second side the main body of the connector toward the first side thereof such that the first and second sets of terminals cross each other when viewed laterally.

11. The circuit board assembly defined in claim 10 wherein the terminals remain substantially within the gap.

12. The circuit board assembly defined in claim 10 wherein the terminals extend laterally outside of the gap.

* * * * *